United States Patent
Tocchio et al.

(10) Patent No.: US 10,329,141 B2
(45) Date of Patent: Jun. 25, 2019

(54) ENCAPSULATED DEVICE OF SEMICONDUCTOR MATERIAL WITH REDUCED SENSITIVITY TO THERMO-MECHANICAL STRESSES

(71) Applicant: STMICROELECTRONICS S.R.L., Agrate Brianza (IT)

(72) Inventors: Alessandro Tocchio, Milan (IT); Carlo Valzasina, Gessate (IT); Luca Guerinoni, Premolo (IT); Giorgio Allegato, Monza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/083,034

(22) Filed: Mar. 28, 2016

(65) Prior Publication Data

US 2017/0088416 A1 Mar. 30, 2017

(30) Foreign Application Priority Data

Sep. 30, 2015 (IT) .................. 102015000056994

(51) Int. Cl.
*H01L 23/13* (2006.01)
*B81B 7/00* (2006.01)
(Continued)

(52) U.S. Cl.
CPC ........ *B81B 7/0048* (2013.01); *B81C 1/00325* (2013.01); *H01L 23/055* (2013.01);
(Continued)

(58) Field of Classification Search
CPC ..... H01L 2924/181; H01L 2224/32145; H01L 21/56; H01L 2224/48247
See application file for complete search history.

(56) References Cited

U.S. PATENT DOCUMENTS

| | | | |
|---|---|---|---|
| 6,169,316 | B1 | 1/2001 | Sakai et al. |
| 6,521,966 | B1 | 2/2003 | Ishio et al. |

(Continued)

FOREIGN PATENT DOCUMENTS

| | | | |
|---|---|---|---|
| DE | 102014016466 A1 | 5/2015 | |
| JP | 2014145623 A | 8/2014 | |

(Continued)

OTHER PUBLICATIONS

Hopkroft et al., "What is the Young's modulus of Silicon," Journal of Microelectromechanical systems, vol. 19, 2010, pp. 229-238.*

(Continued)

*Primary Examiner* — Julia Slutsker
(74) *Attorney, Agent, or Firm* — Seed Intellectual Property Law Group LLP (57) ABSTRACT

An encapsulated device of semiconductor material wherein a chip of semiconductor material is fixed to a base element of a packaging body through at least one pillar element having elasticity and deformability greater than the chip, for example a Young's modulus lower than 300 MPa. In one example, four pillar elements are fixed in proximity of the corners of a fixing surface of the chip and operate as uncoupling structure, which prevents transfer of stresses and deformations of the base element to the chip.

12 Claims, 6 Drawing Sheets

(51) Int. Cl.
*B81C 1/00* (2006.01)
*H01L 23/055* (2006.01)
*H01L 23/16* (2006.01)

(52) U.S. Cl.
CPC .............. *H01L 23/13* (2013.01); *H01L 23/16* (2013.01); *H01L 2224/32145* (2013.01); *H01L 2224/48145* (2013.01); *H01L 2224/48235* (2013.01); *H01L 2224/73265* (2013.01); *H01L 2924/1433* (2013.01); *H01L 2924/1461* (2013.01); *H01L 2924/15153* (2013.01); *H01L 2924/15313* (2013.01); *H01L 2924/16195* (2013.01); *H01L 2924/16251* (2013.01); *H01L 2924/3511* (2013.01)

(56) References Cited

U.S. PATENT DOCUMENTS

| | | | |
|---|---|---|---|
| 6,768,196 B2* | 7/2004 | Harney | B81B 7/0048 257/729 |
| 7,121,141 B2 | 10/2006 | McNeil | |
| 7,166,911 B2* | 1/2007 | Karpman | B81B 7/0048 257/669 |
| 8,434,364 B2 | 5/2013 | Cazzaniga et al. | |
| 9,340,409 B1* | 5/2016 | Gurin | B81B 7/0048 |
| 2001/0055836 A1* | 12/2001 | Kunda | B81C 1/00333 438/108 |
| 2004/0041279 A1* | 3/2004 | Fuller | H01L 21/563 257/782 |
| 2007/0273018 A1* | 11/2007 | Onozuka | B81C 1/0023 257/690 |
| 2009/0273075 A1* | 11/2009 | Meyer-Berg | H01L 23/5389 257/693 |
| 2012/0049300 A1* | 3/2012 | Yamaguchi | G01L 19/147 257/417 |
| 2013/0026583 A1* | 1/2013 | Matsukawa | G01C 19/5628 257/415 |
| 2013/0264722 A1* | 10/2013 | Okada | H01L 25/04 257/777 |
| 2014/0291785 A1* | 10/2014 | Kasai | H04R 19/005 257/416 |
| 2015/0001651 A1 | 1/2015 | Faralli et al. | |
| 2015/0021754 A1* | 1/2015 | Lin | H01L 23/5389 257/712 |
| 2015/0054107 A1* | 2/2015 | Miyake | H01L 31/0203 257/433 |
| 2015/0143926 A1 | 5/2015 | Doering | |
| 2015/0208507 A1 | 7/2015 | Walmsley et al. | |
| 2015/0243573 A1* | 8/2015 | Hu | H01L 21/304 257/793 |

FOREIGN PATENT DOCUMENTS

| | | |
|---|---|---|
| WO | 2013180696 A1 | 12/2013 |
| WO | 2014021868 A1 | 2/2014 |
| WO | 2015059301 A1 | 4/2015 |

OTHER PUBLICATIONS

Pabst et al., "Eastic properties of silica polymorphs—a review," Ceramics—Silikáty 57 (3) 167-184 (2013).*
Basaran et al., "Measuring intrinsic elastic modulus of Pb/Sn solder alloys," Mechanics of Materials 34 (2002) 349-362.*
Ogorkiewicz, "Linear elastic characteristics of a cast epoxy resin," The Journal of Strain Analysis for Engineering Design. vol. 8, No. 2, pp. 132-133, (1973).*
Wang et al., "Liquid crystal polymer (LCP) for MEMS: processes and applications," J. Micromech. Microeng. 13 (2003), pp. 628-633.*

* cited by examiner

Fig.1
Known Art

Fig.2
Known Art

Fig.3
Known Art

Fig.4A
Known Art

Fig.5A
Known Art

Fig.4B
Known Art

Fig.5B
Known Art

Fig.6
Known Art

ENCAPSULATED DEVICE OF SEMICONDUCTOR MATERIAL WITH REDUCED SENSITIVITY TO THERMO-MECHANICAL STRESSES

BACKGROUND

Technical Field

The present disclosure relates to an encapsulated device of semiconductor material with reduced sensitivity to thermo-mechanical stresses. In particular, the following description regards a MEMS (Micro-Electro-Mechanical System) device of an inertial type, such as an accelerometer or a gyroscope of a capacitive type, without the disclosure being limited thereto.

Description of the Related Art

As is known, semiconductor devices, such as MEMS devices, are generally encapsulated in packages to enable protection and handling thereof. Hereinafter, reference is made to packages enabling surface mounting, even though the disclosure is not limited thereto.

Figure 1:
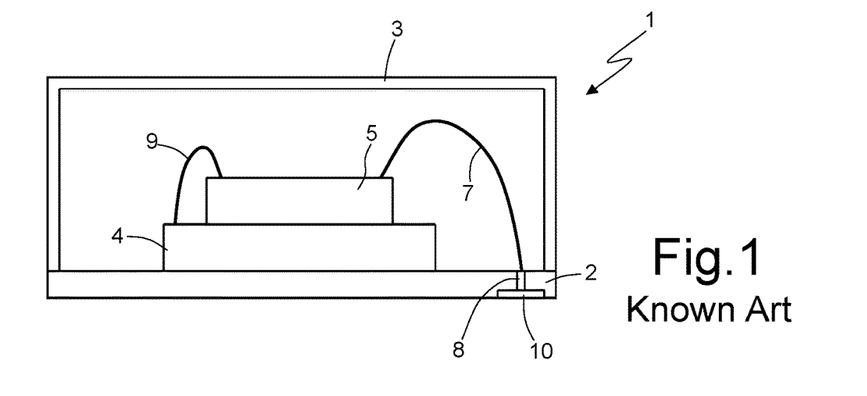
FIG. 1 is a cross-sectional view of a known encapsulated device.
Figure 2:
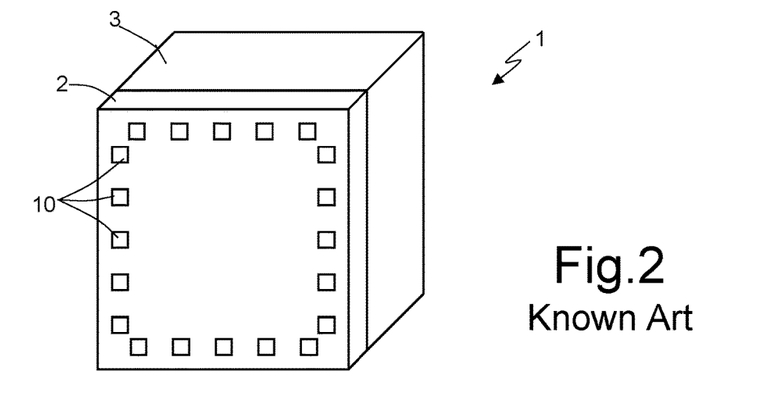
FIG. 2 is a bottom perspective view of the encapsulated device of FIG. 1.

Currently, the type of surface-mount package that is most widely used for MEMS sensors is the so-called LGA (Land-Grid Array) package, which has a square grid of contacts on the bottom side of the package. FIGS. 1 and 2 illustrate an example of package of an LGA type in cross-section and in perspective view from the back, respectively.

In particular, FIG. 1 shows an example of an encapsulated MEMS device 1, comprising a base 2, a cap 3, a first chip 4 bonded to the base 2, and a second chip 5 bonded to the first chip. The base 2 may be formed by a support of different material, for example of fiberglass or ceramic, and the cap may be metal, polymeric, or ceramic material. The first chip 4 may be a MEMS component, for example of a capacitive type and including sensing structures of an inertial type, such as an accelerometer or a gyroscope, and the second chip 5 may be an integrated circuit, such as an ASIC (Application-Specific Integrated Circuit), including signal-processing circuits.

Generally, the second chip 5 is electrically coupled to the first chip 4 so as to receive the measuring signals supplied by the latter and supply on the outside the values of the measured quantities and/or of quantities correlated thereto.

As an alternative to the above, the package may be obtained with the full-molded technique, and the first and second chips 4, 5 may be surrounded by an encapsulation mass that completely envelops them and fills the volume of the package.

FIG. 2 shows the arrangement of the rear contacts, designated by 10 and arranged peripherally with respect to the base 2. The contacts 10 are made of metal material, such as copper, and are connected to the second chip 5 via conductive bonding wires 7 and through vias 8 (FIG. 1). Conductive wires 9 connect the chips 4, 5 together.

Figure 3:
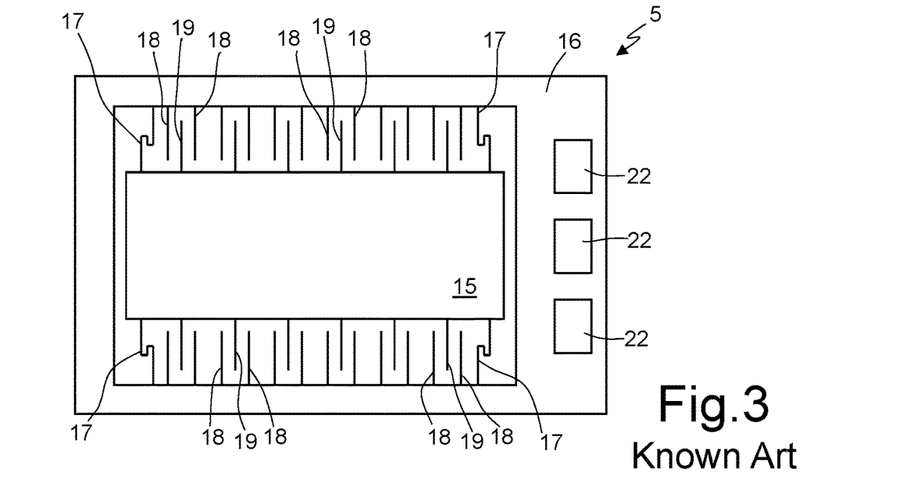
FIG. 3 is a schematic top plan view of the architecture of a known MEMS device.

FIG. 3 shows a schematic top plan view of an example of the structure of an MEMS component 5 forming an accelerometer or an inertial gyroscope. The MEMS component 5 comprises a suspended mass 15 arranged over a substrate (not visible in FIG. 3) and supported by a fixed region 16 via springs 17. The fixed region 16 extends all around the suspended mass 15 and is fixed with respect to the substrate. Fixed electrodes 18 extend from the fixed region 16 to the suspended mass 15 and are combfingered to mobile electrodes 19, which extend from the suspended mass 15 to the fixed region 16.

Contact pads 22 on the fixed region 16 are coupled to the terminals 10 by the bonding wires of FIGS. 1 and 2.

The shown package structure is sensitive to thermo-mechanical stresses, for example generated by temperature jumps, humidity, aging, environmental conditions and other mechanical stresses that cause bending or other deformation of the base 2. For instance, since the materials of the first chip 4 and of the base 2 are different, and thus have different thermal expansion coefficients, an exposure to temperature gradients may cause deformations or warpage of the package. These deformations may cause changes of distance between the fixed and mobile electrodes 18, 19, thereby affecting the output parameters of the signals generated by the first chip 4, jeopardizing the accuracy of the measurements, and determining operating uncertainties.

In this connection, reference may be made to FIGS. 4A, 4B, and 5A, 5B, which show the effects on a MEMS device of a stress due to a temperature variation $\Delta T>0$ and the effects of a stress due to a temperature variation $\Delta T<0$, respectively.

Figure 4A:
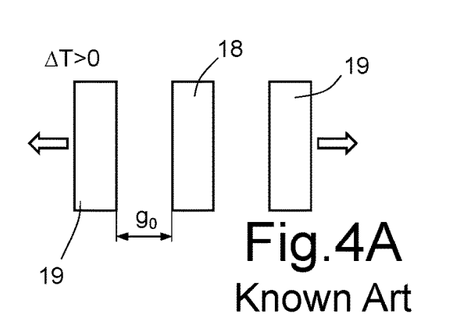
FIGS. 4A and 5A are schematic illustrations of the relative position of the mobile and fixed electrodes in presence of a substrate deformation due to a positive temperature gradient.
Figure 4B:
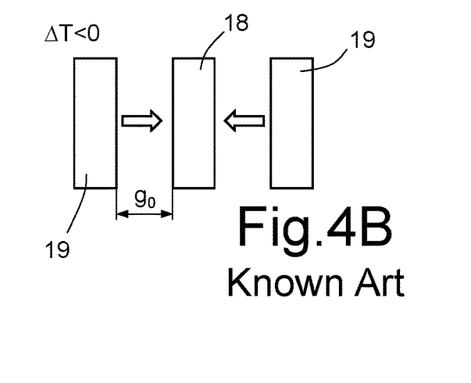
FIGS. 4B and 5B are schematic illustrations of the relative position of the mobile and fixed electrodes in presence of a substrate deformation due to a negative temperature gradient.
Figure 5A:
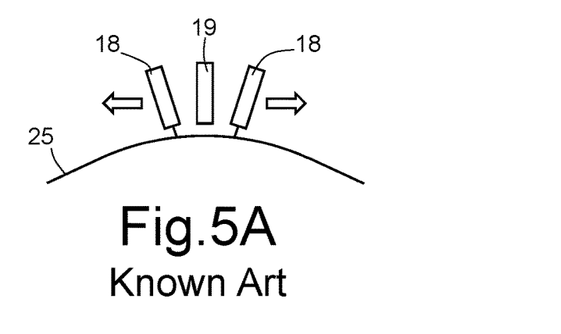
Figure 5B:
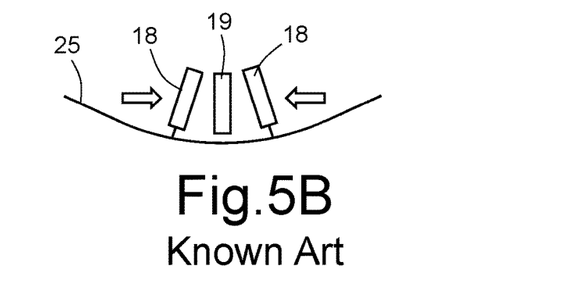

As may be noted in FIGS. 4A, 5A, an increase in temperature may cause bending of the substrate (here designated by 25) upwards (the convexity facing the electrodes 18, 19), which in turn causes an increase of the rest distance $g_0$. Instead, a reduction of temperature (FIGS. 4B, 5B) may cause bending of the substrate 25 downwards (the concavity facing the electrodes 18, 19) that causes a reduction of the rest distance $g_0$.

For instance, when the chip 4 is an accelerometer, the modification of the differential distance may modify the value of the d.c. signals (the so-called "0-g level drift") and the expected sensitivity drift. When the chip 4 is a gyroscope, the modification of distance between the electrodes may affect the quality factor, the resonance frequency, and the quadrature, bringing about a zero-level drift and, also in this case, the expected sensitivity drift.

To eliminate or at least reduce the effect of mechanical stresses on the output parameters of the MEMS device, various solutions have been proposed both of an architectural type and of a structural type.

For instance, U.S. Pat. No. 8,434,364 proposes an optimization of the anchoring position for reducing the deviation of the parameter values of the output signals in the presence of warpage of the substrate of the chip.

Figure 6:
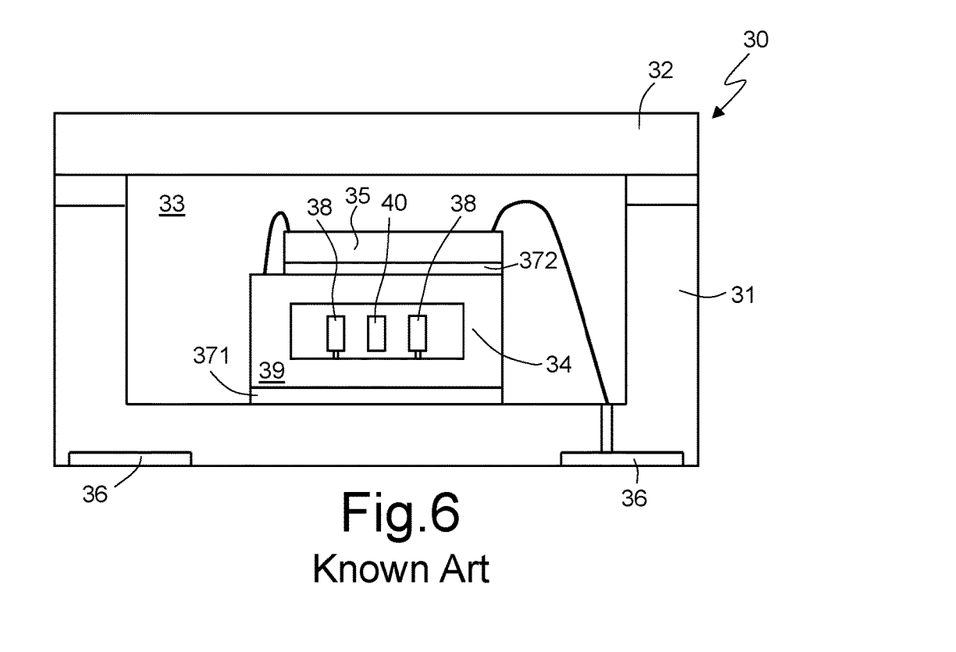
FIG. 6 is a cross-sectional view of a known encapsulated device.

Other solutions envisage the use of packages that employ low-stress materials and/or materials having similar stress characteristics. For instance, FIG. 6 shows an encapsulated device 30 wherein the package is formed by a ceramic body 31 and a lid 32, also generally made of ceramic material. The ceramic body 31 has a cavity 33 housing first and second chips 34, 35. For instance, the first chip 34 is a MEMS sensor, and is bonded on the bottom of the ceramic body 31, within the cavity 33, via a first adhesive layer 371, for example a continuous DAF (Die-Attach Film) layer, used in the semiconductor industry. For instance, the first adhesive layer 371 may be a laminated epoxy resin. The second chip 35 is, for example, formed by an ASIC and is bonded on top of the first chip 34 via a second adhesive layer 372, for example a DAF layer. Electrical connections (not shown) couple the chips 34 and 35 to terminals 36 formed in the ceramic body 31.

FIG. 6 further schematically shows fixed electrodes 38 rigid with a substrate 39 of the first chip 34 and a mobile electrode 40 facing the fixed electrodes 38.

The ceramic material used has the advantage of having a thermal expansion coefficient similar to silicon that forms the chips 34, 35, thus reducing the deformations due to thermal effects, and attenuating mechanical stresses coming from outside, but is not sufficient to reduce the reliability of the variations of parameters in all the other cases.

It follows that current solutions are not always sufficient to eliminate the undesirable effects.

BRIEF SUMMARY

One or more embodiments are directed to encapsulated microelectromechanical devices and methods of manufacturing the same. One embodiment is directed to a semiconductor package that includes a packaging body having a base element. A first chip of semiconductor material is coupled to the base element by at least one pillar element. The pillar element has a first Young's modulus and the semiconductor material of the first chip has a second Young's modulus. The first Young's modulus is less than the second Young's modulus. In another embodiment, the first chip of semiconductor material is coupled to the base element by a plurality of pillar elements. The first chip includes a microelectromechanical device. The semiconductor package may include a second chip of semiconductor material that is coupled to the first chip. The second chip is an ASIC.

BRIEF DESCRIPTION OF THE SEVERAL VIEWS OF THE DRAWINGS

For a better understanding of the present disclosure a preferred embodiment thereof is now described, purely by way of non-limiting example, with reference to the attached drawings, wherein.

DETAILED DESCRIPTION

Figure 7:
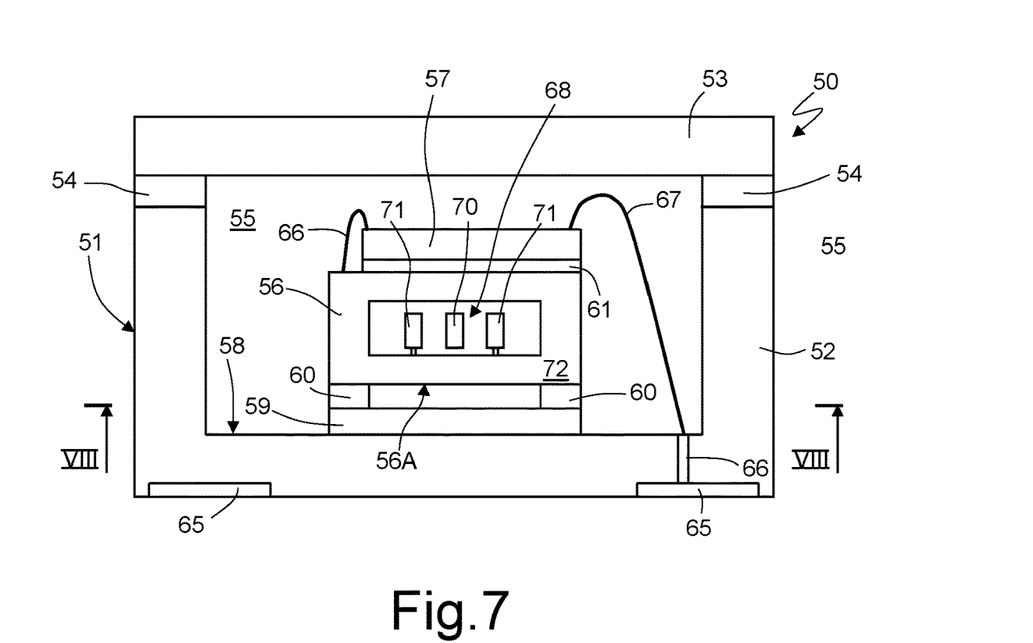
FIG. 7 is a cross-sectional view of an embodiment of the present encapsulated device.

FIG. 7 shows an encapsulated device 50 comprising a packaging body 51 formed by a base element 52 and by a cap 53, which is bonded to the base element 52 via a fixing region 54, for example a resin film. The base element 52 and the cap 53 are, for example, of ceramic material and define inside a cavity 55 housing first and second chips 56, 57 including semiconductor material, such as silicon.

For instance, the first chip 56 may be a MEMS sensor including sensitive structures 68, for example sensing structures of an inertial type, such as an accelerometer or a gyroscope of a capacitive type. The second chip 57 may be an integrated circuit, such as an ASIC, including signal-processing circuits, in a way similar to known encapsulated devices.

The first chip 56 has a fixing surface (here the bottom surface 56A) fixed to the base element 52, within the cavity 55. Specifically, the bottom surface 56A of the first chip is fixed to a bottom side 58 of the base element 52 via a support 59 and pillars 60, as explained in greater detail hereinafter. The second chip 57 is bonded on top of the first chip 56 (thus to a top side thereof) via an adhesive layer 61, for example a DAF.

The base element 52 incorporates contact terminals 65, arranged peripherally, facing and level with the bottom surface of the base element 52. The contact terminals 65 are typically of metal material, for example copper, and are connected to the second chip 57 via through connections 66 (just one shown in FIG. 7), bonding wires 67 (just one shown in FIG. 7) and contact pads (not shown, similar to the pads 22 of FIG. 3). Bonding wires 66 (just one shown) connect the chips 56, 57 together. The first chip 56 is manufactured in a known way; for example the sensitive structure 68 comprises a suspended mass (not visible), mobile electrodes 70 (just one shown) and fixed electrodes 71 comb-fingered to the mobile electrodes and rigid with a substrate 72 of the first chip 56.

The support 59 is formed, for example, by a die of semiconductor material, such as silicon, bonded in any known way to the bottom side 58 of the base element 52, for instance via a further adhesive layer (not shown), for example a DAF.

The pillars 60 are of a material with low Young's modulus, lower than that of the first chip 56, for example below 500 MPa, typically below 300 MPa, for example of dry resist with Young's modulus of approximately 180 MPa. The pillars 60 have, for example, a thickness comprised between 50 µm and 100 µm.

Figure 8:
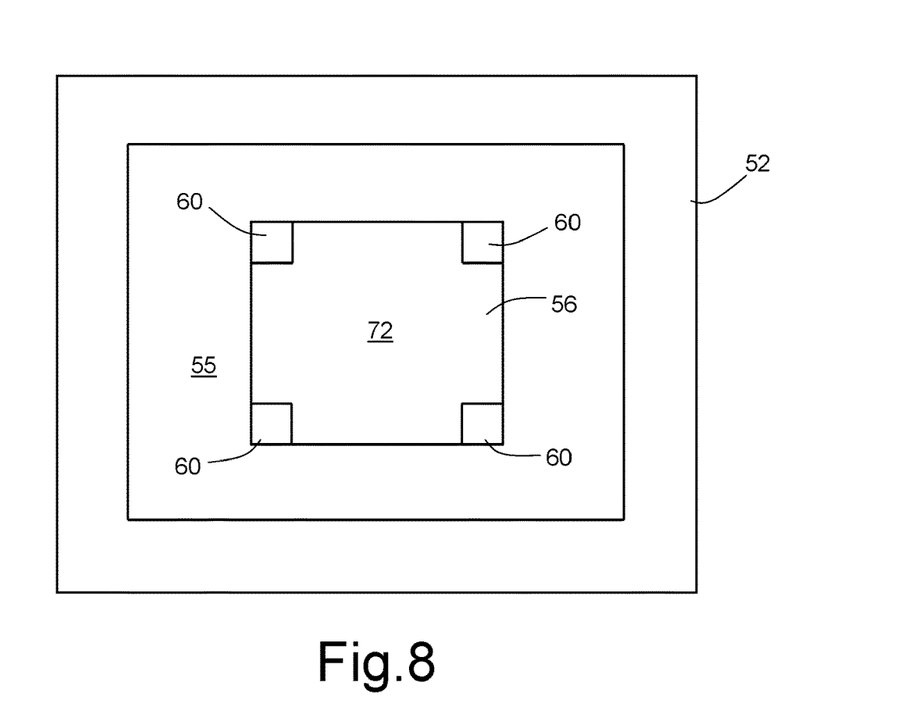
FIG. 8 shows a cross-sectional view taken along the plane of section VIII-VIII of FIG. 7.

As shown in FIG. 8, the pillars 60 are arranged in a peripheral position, on the four corners of the bottom surface 56A of the first chip 56 for providing a good support for the first chip 56 and prevent it from turning over during assembly.

Figure 11:
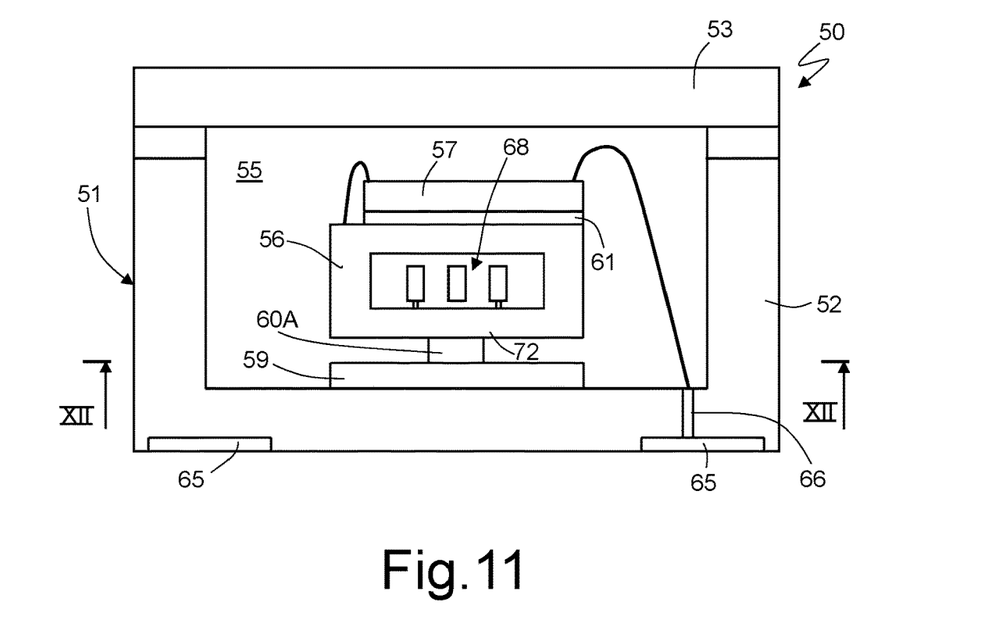
FIG. 11 is a cross-sectional view of a different embodiment of the present encapsulated device.
Figure 12:
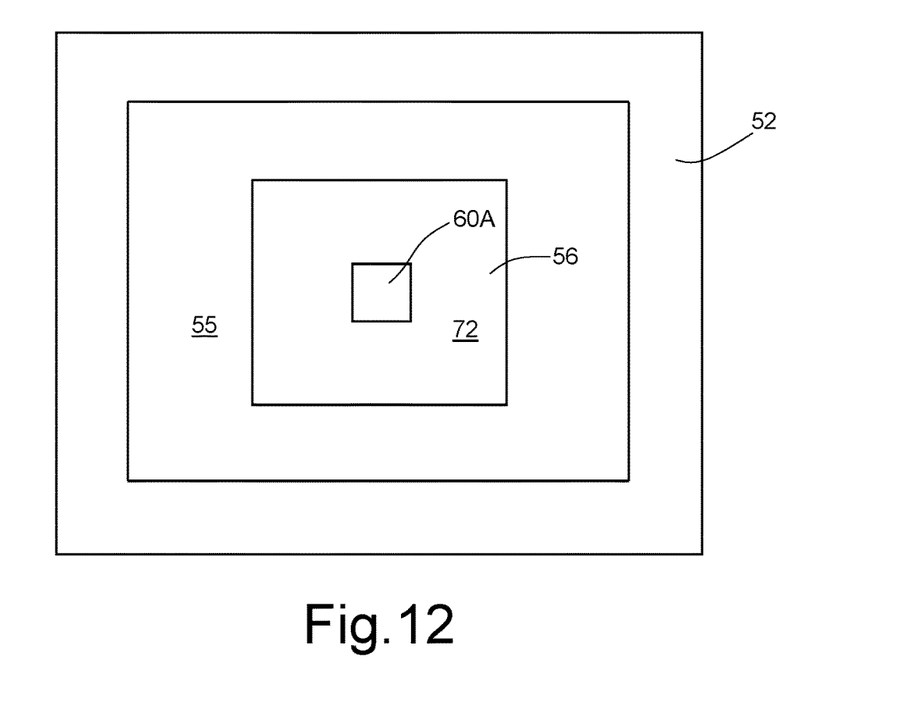
FIG. 12 shows a cross-sectional view taken along the plane of section XII-XII of FIG. 11.

As an alternative, instead of peripheral pillars 60, it is possible to provide a single central pillar 60A, as shown in FIGS. 11 and 12.

In this way, the first chip 56 is fixed to the packaging body 51 (through the support 58) in a selective way, only in some points (at the pillars 60; 60A) and not throughout its bottom surface 56A. In practice, an empty space, i.e., a physical discontinuity, exists between the first chip 56 and the support 58, so that any possible deformations of the packaging body 51 (and of the support 58) are not transferred onto the first chip 56, at least because of the absence of contiguity. For instance, the total area of the pillars 60, 60A varies between 0.5% and 20% of the area of the fixing surface 56A of the first chip 56. In one embodiment, for a first chip 56 of 3 mm×2 mm, the pillars 60 may have a total area of 200 µm².

Figure 9:
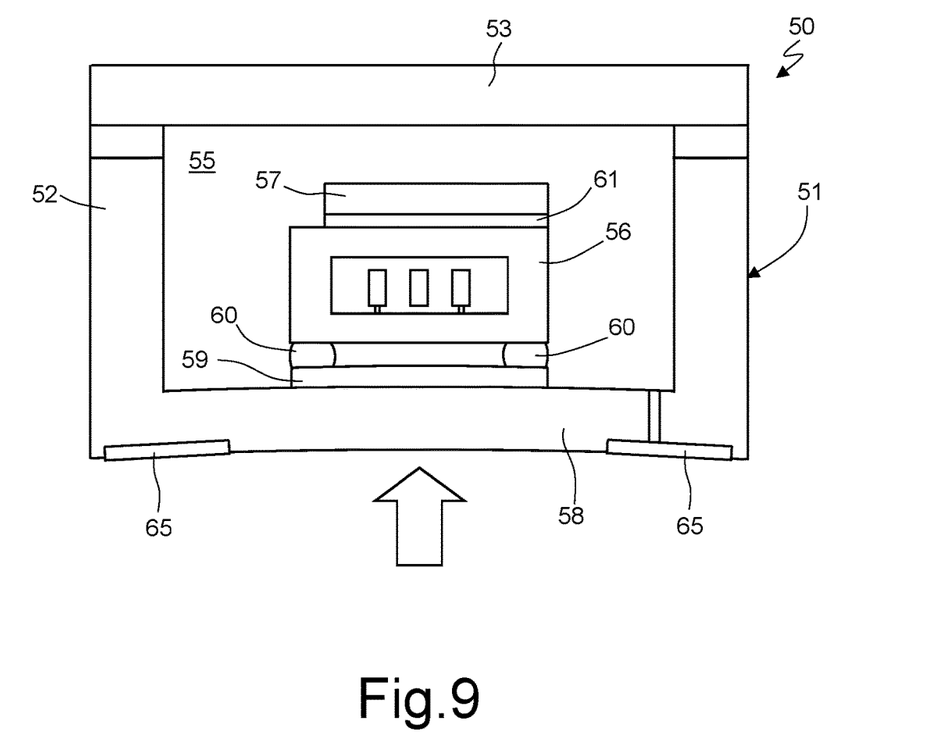
FIG. 9 shows the behavior of the device of FIG. 7 in presence of a stress due to an external force.

Since the pillars 60, 60A have a much greater elasticity than silicon (of the order of hundreds of GPa), and further due to the absence of physical contiguity between the entire bottom surface 56A of the first chip 56 and the support 59, the pillars 60, 60A absorb possible forces that cause deformation of the base element 52, in particular of the bottom side 58, as shown in FIG. 9. Here, a stress equivalent to a force acting from outside on the bottom side 58 causes a deformation of the bottom side 58 and of the support 59 towards the inside of the encapsulated device 50.

Consequently, in the presence of stresses and deformations on the bottom side of the package body, a preferential deformation of the pillars 60, 60A, and the substrate 72 of the first chip 56 remains rigid and undeformed, rejecting the deformations.

In this way, an uncoupling is created between the first chip 56 and the packaging body 51.

The arrangement of the pillars 60 on the corners of the bottom surface 56A of the chip 56 provides a very good compromise between the deformation rejection behavior of the packaging body 51 and the assembly operations. In any case, the arrangement of the central pillar 60A provides very good deformation rejection performance.

Figure 10:
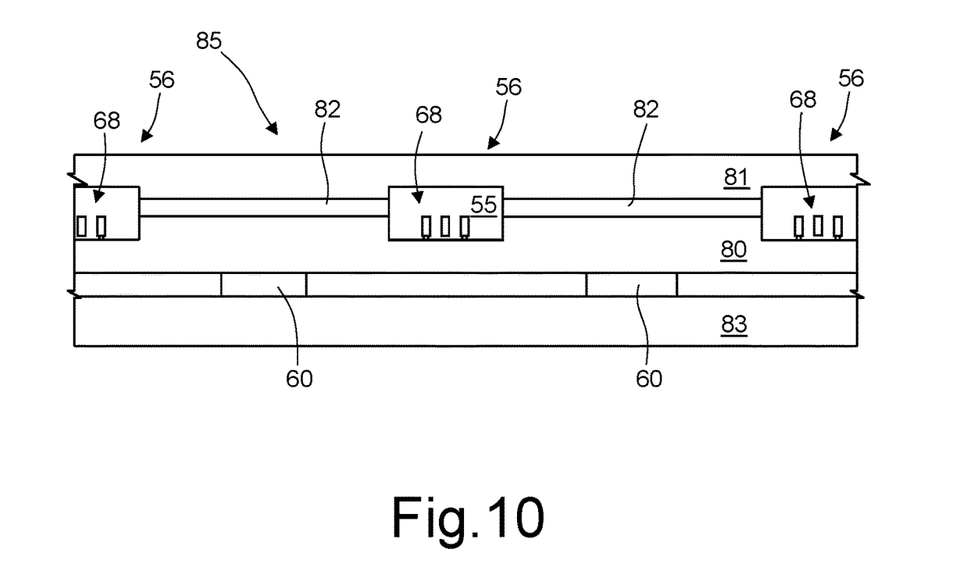
FIG. 10 is a cross-sectional view of a manufacturing step for the present encapsulated device.

The encapsulated device 50 may be manufactured in the front-end stage using a three-wafer bonding process, as shown, for example, in FIG. 10. FIG. 10 regards formation of peripheral pillars 60. What described hereinafter for the peripheral pillars 60 applies in any case also for a single central pillar 60A, or for pillars however arranged and in whatever number.

FIG. 10 shows a composite wafer 85 comprising three wafers 80, 81, and 83. A first wafer 80 is bonded to a second wafer 81 via a glass-frit layer 82. The first wafer 80 houses the sensitive structures 68 of a plurality of first chips 56, including the fixed and mobile electrodes 71, 70, and the second wafer 81 operates as cap that closes and insulates the sensitive parts 68 from outside.

The pillars 60 are formed on the outer (bottom) surface of the first wafer 80 and a third wafer 83 is bonded to the first wafer 80 through the pillars 60 or vice versa.

The composite wafer 85 of FIG. 10 is manufactured as described hereinafter. Initially, the sensitive structures 68 are formed in the first wafer 80 using known photolithographic techniques; the first and second wafers 80 are bonded together via the glass-frit layer 82; the pillars 60 are formed on the outer surface of the first wafer 80 via spinning of dry-resist material and definition via known photolithographic techniques, and then the third wafer 83 is bonded to the first wafer 80.

The composite wafer 85 of FIG. 10 is diced to form a composite chip that includes the first chip 56 and the support 59 operating as handling support. The second chip 57 is bonded to the first chip 56 via the adhesive layer 61 and the ensemble 56+57+59 is fixed to the bottom side 58 of the base element 52. Finally, the lid 53 is glued on top.

As an alternative, a fourth wafer, including a plurality of ASICs, is bonded to the composite wafer 85 of FIG. 10 prior to dicing.

According to a different embodiment, the pillars 60 may be formed using photolithographic techniques, by depositing a layer of a high-elasticity material, for example dry resist, which is then defined to form the pillars.

The possibility of forming the uncoupling structure (pillars 60, 60A) at wafer level enables a high manufacturing accuracy and makes it possible to manufacture MEMS components on a large scale that are stable as regards production spread, at manufacturing costs that are comparable to those of known encapsulated devices.

Finally, it is clear that modifications and variations may be made to the device and to the process described and illustrated, without thereby departing from the scope of the present disclosure.

For instance, the type of encapsulated device is not limiting: in particular, a single chip may be provided, fixed to the bottom side 58 of the base element 52, directly or through a support. The chip (whether single or composite) may be formed by any type of MEMS or by any other semiconductor chip that is to be mechanically decoupled from the package.

The pillars 60 may be of organic materials, resist, or soft glues, provided that they have high elasticity as compared to silicon.

Further, the position and number of pillars 60 may vary. For instance, the pillars 60 may be arranged at a distance from the edge of the fixing surface 56A or may be in a different number, for example three or five, preferably arranged in symmetrical positions with respect to the centroid of the chips 56, 57.

Figure 13:
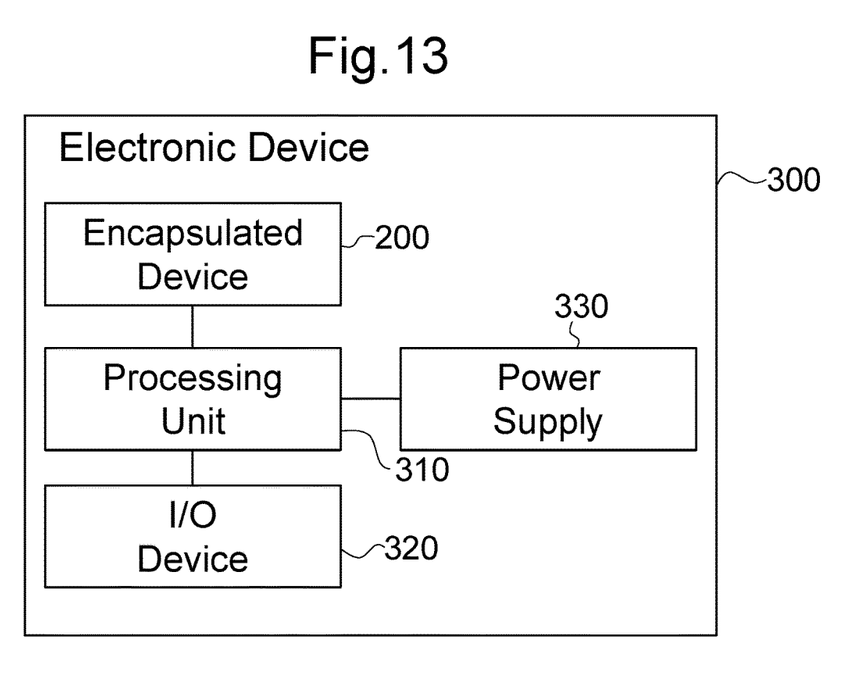
FIG. 13 is a block diagram of an electronic device including an encapsulated device.

FIG. 13 illustrates a block diagram of an electronic device that includes a encapsulated device, such as the encapsulated devices of FIGS. 7 and 11. The electronic device may be a mobile communications apparatus, such as a mobile phone and a personal digital assistant, a laptop, a desktop computer, a camera or video device including a network video, a vehicle parking sensor, a wearable device, such as a smartwatch, or any other electronic device. The electronic device 300 includes a processing unit 310 and a encapsulated device 200 that is electrically coupled to the processing unit. The processing unit 310 includes control circuitry, which may include one or more processors, memory, and discrete logic. The processing unit 310 is configured to transmit signal to and receive signals from the encapsulated device 200. The electronic device may further include an input/output device 320, for example, a keyboard or a display that is coupled to the processing unit. The electronic device may further include a power supply 330, which may be a battery or components for coupling to an external power source.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
   a packaging body having a base element;
   a supporting chip coupled to the base element;
   a MEMS sensor chip of semiconductor material; and
   a plurality of pillar elements directly coupling only corners of a back surface of the MEMS sensor chip to the supporting chip such that empty space is provided between a central portion of the back surface of the MEMS sensor chip and a portion of the supporting chip, the plurality of pillar elements being resist and having a first Young's modulus, the semiconductor material of the MEMS sensor chip having a second Young's modulus, the first Young's modulus being less than the second Young's modulus.

2. The device according to claim 1 wherein an Application-Specific Integrated Circuit (ASIC chip) is bonded to the MEMS sensor chip.

3. The device according to claim 1, wherein the back surface of the MEMS sensor chip is rectangular shaped.

4. The device according to claim 1 wherein the plurality of pillar elements are arranged at each corner of the back surface of the MEMS sensor chip.

5. The device according to claim 1 wherein the packaging body is a ceramic material.

6. The device according to claim 1 wherein the first Young's modulus is less than 500 MPa.

7. A process comprising:
forming a plurality of pillar elements directly on at least one of a back surface of a MEMS sensor chip of semiconductor material and a base element, the plurality of pillar elements being resist and having a first Young's modulus, the semiconductor material having a second Young's modulus, the first Young's modulus being less than the second Young's modulus; and
fixing the MEMS sensor chip directly to the base element by the plurality of pillar elements, wherein the plurality of pillar elements are located at only corners of the MEMS sensor chip and couples the MEMS sensor chip directly to the base element so that empty space is between a central portion of the back surface of the MEMS sensor chip and the base element.

8. The process according to claim 7 wherein the MEMS sensor chip has a rectangular shape.

9. The process according to claim 7 wherein forming the plurality of pillar elements comprises forming the plurality of pillar elements directly on the back surface of the MEMS sensor chip of semiconductor material and is carried out at a wafer level to obtain a composite wafer comprising a plurality of MEMS sensor chips, the process further comprising dicing the composite wafer to obtain a plurality of individual composite MEMS sensor chips.

10. The process according to claim 7 further comprising bonding an Application-Specific Integrated Circuit (ASIC) chip to the MEMS sensor chip.

11. An electronic device comprising:
a semiconductor package comprising:
a packaging body having a base element;
a MEMS sensor chip of semiconductor material, the MEMS sensor chip having a back surface facing the base element; and
a plurality of pillar elements directly coupling only corners of the back surface of the MEMS sensor chip to the base element, wherein the plurality of pillar elements are spaced apart from each other such that a central portion of the back surface of the MEMS sensor chip remains exposed and perimeter portions of the back surface of the MEMS sensor chip between the plurality of pillar elements remain exposed, the plurality of pillar elements being resist and having a first Young's modulus, the semiconductor material of the MEMS sensor chip having a second Young's modulus, the first Young's modulus being less than the second Young's modulus; and
a processing unit configured to receive signals from the semiconductor package.

12. The electronic device according to claim 11 wherein the MEMS sensor chip includes a movable mass, and wherein the semiconductor package further comprises an Application-Specific Integrated Circuit (ASIC) chip of semiconductor material coupled to the MEMS sensor chip and configured to receive and process signals from the MEMS sensor chip.

* * * * *